(12) United States Patent
Wu

(10) Patent No.: US 6,542,369 B1
(45) Date of Patent: Apr. 1, 2003

(54) FIXING FRAME FOR CPU COOLING DEVICES

(75) Inventor: Lee-Jen Wu, Taipei Hsien (TW)

(73) Assignee: Nextronics Engineering Corp., Taipei Hsien (TW)

( * ) Notice: Subject to any disclaimer, the term of this patent is extended or adjusted under 35 U.S.C. 154(b) by 0 days.

(21) Appl. No.: 10/026,793

(22) Filed: Dec. 27, 2001

(51) Int. Cl.⁷ ................................................. H05K 7/20
(52) U.S. Cl. ........................ 361/704; 257/713; 257/718; 257/719; 257/726; 257/727; 248/316.7; 248/505; 248/510; 165/80.3; 165/185; 174/16.3; 361/687; 361/703; 361/704; 361/709–712
(58) Field of Search ................................. 257/713, 718, 257/719, 726, 727; 248/316.7, 505, 510; 165/80.3, 185; 174/16.3; 361/687, 703, 704, 709–712, 717–719, 722

(56) References Cited

U.S. PATENT DOCUMENTS 5,493,475 A * 2/1996 Lin ............................. 361/710
6,193,205 B1 * 2/2001 Wang ......................... 248/510
6,205,026 B1 * 3/2001 Wong et al. ................. 361/704

* cited by examiner

*Primary Examiner*—Gerald Tolin
(74) *Attorney, Agent, or Firm*—Rosenberg, Klein & Lee

(57) ABSTRACT

This invention provides a combined base frame for supporting and fixing a CPU heat sink. The base frame has a left-side frame body and a right-side frame body. The buckling pieces are integrally formed under the base frame. The base frame can be efficiently mounted on a circuit board by the engagement between the left-side frame body and a right-side frame body. When an operator needs to install a CPU onto the circuit board, the base frame can be disassembled in a short time.

3 Claims, 6 Drawing Sheets

FIXING FRAME FOR CPU COOLING DEVICES

BACKGROUND OF THE INVENTION

1. Field of the Invention

The present invention relates to a fixing frame for CPU cooling devices, and more particularly, to an engagement mechanism of a fixing frame for CPU heat dissipating sinks.

2. Description of the Prior Art

FIG. 1 and FIG. 2 illustrate a prior art fixing device for installing a radiator. The fixing device as illustrated is a frame structure having a central opening that allows an integrated circuit to pass. The fixing device includes an inner periphery area 11 having larger mounting surface at corners of the fixing device. As illustrated in FIG. 1, there are four positioning holes 12 located on the mounting surface at four corners. A buckling piece 13 passes through each of the positioning holes 12. The buckling piece 13 has a lower portion that inserts into a fixing hole 15 of a circuit board 14. As shown in FIG. 2, a radiator or heat sink 17 is typically installed on the fixing device to contact the underlying integrated circuit (not shown).

However, the prior art encounters several drawbacks. First, when installing the prior art fixing device onto a circuit board, a user or an operator of a assembling factory needs to press the four buckling pieces 13 one by one, and when uninstalling the fixing device he or she needs to pull out the four buckling pieces 13 by tools such as an extractor, thereby rendering the entire assembling process time-consuming and inefficient. Second, the prior art fixing device is subject to disengagement during shipping to a main assembling factory. Consequently, there is a strong need for providing a fixing device that meets the requirements of fast assembling and disassembling.

SUMMARY OF THE INVENTION

It is a primary object of the present invention to provide a fixing device mounting mechanism that can meet the requirements of fast assembling and disassembling.

According to the claimed invention, the fixing device includes a left-side frame body with a U-shaped structure from a top view, wherein said left-side frame body has a first long side, two first short sides, and first inner peripheries located at the intersections of said first long side and two first short sides, and wherein a first buckling piece is integrally formed under said first inner periphery and a slot is installed on a distal portion of each of said first short sides with a through hole thereon. A right-side frame body with a U-shaped structure from a top view, wherein said right-side frame body has a second long side, two second short sides, and second inner peripheries located at the intersections of said second long side and two second short sides, and wherein a second buckling piece is integrally formed under said second inner periphery and an extending wedge member is installed on a distal portion of each of said second short sides with a mid-passing hole formed thereon. A pair of mounting pieces, wherein each of said mounting pieces passes through said through hole and said mid-passing hole to fix said extending wedge member that inserts into said slot, and wherein said left-side frame body and said right-side frame body define an opening for accommodating a CPU and a heat sink is installed on said first and second inner peripheries for contacting the CPU.

It is to be understood that both the forgoing general description and the following detailed description are exemplary, and are intended to provide further explanation of the invention as claimed. Other advantages and features of the invention will be apparent from the following description, drawings and claims.

DETAILED DESCRIPTION OF THE PREFERRED EMBODIMENT

Figure 1:
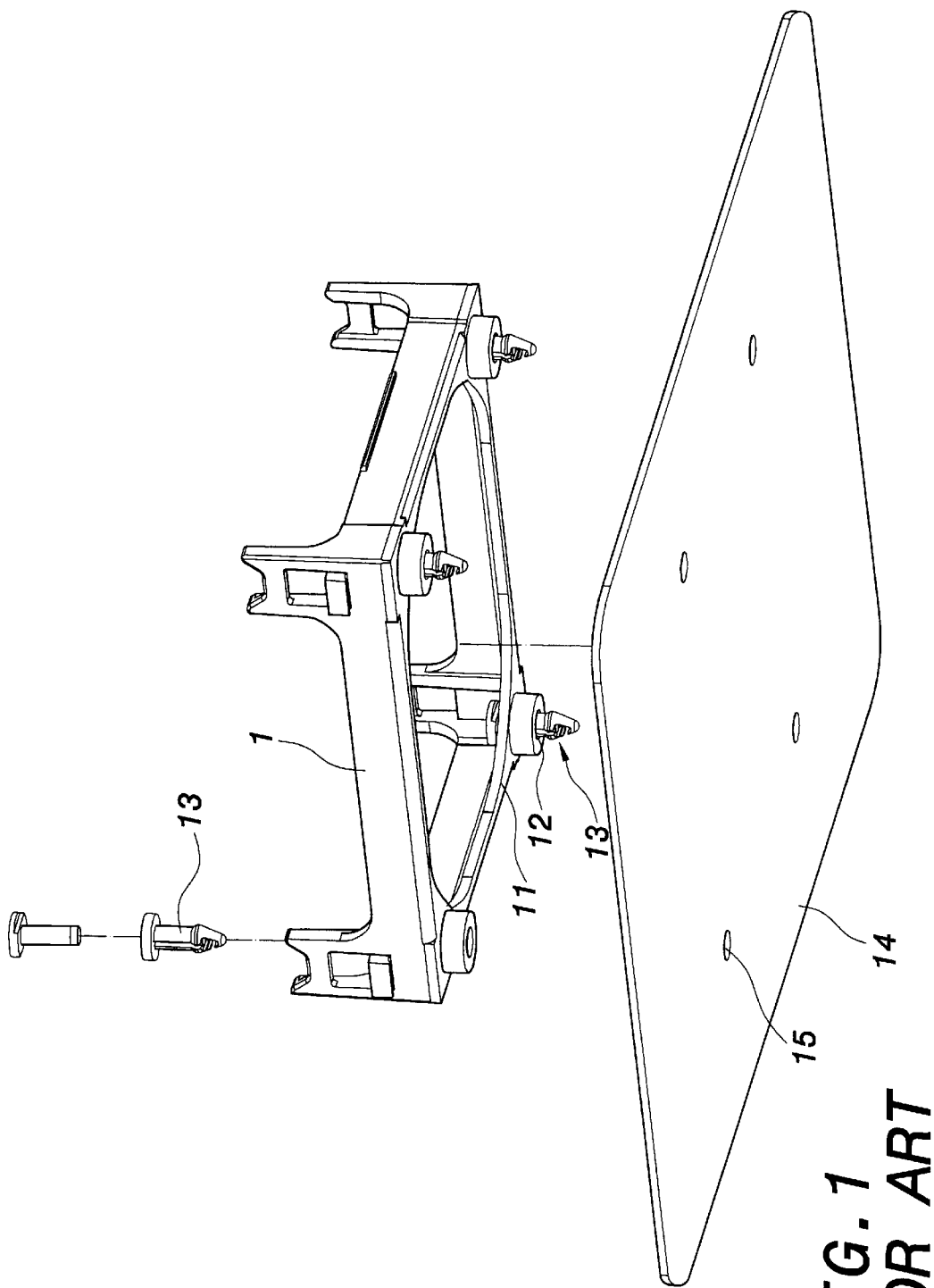
FIG. 1 and FIG. 2 illustrate a prior art fixing device for installing a radiator.
Figure 2:
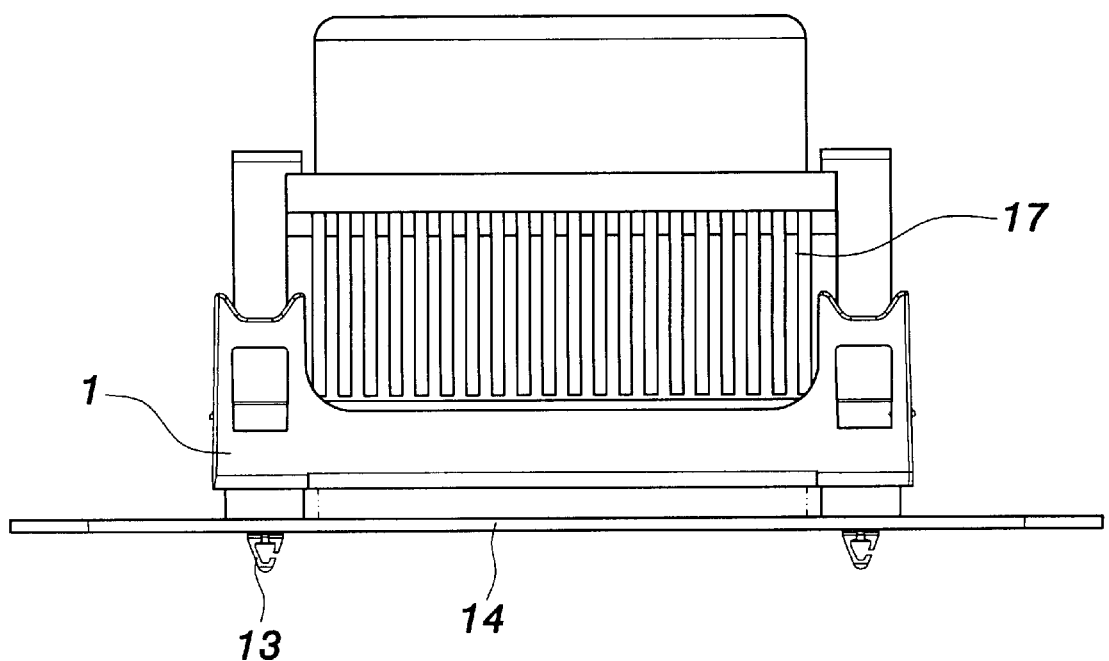
Figure 3:
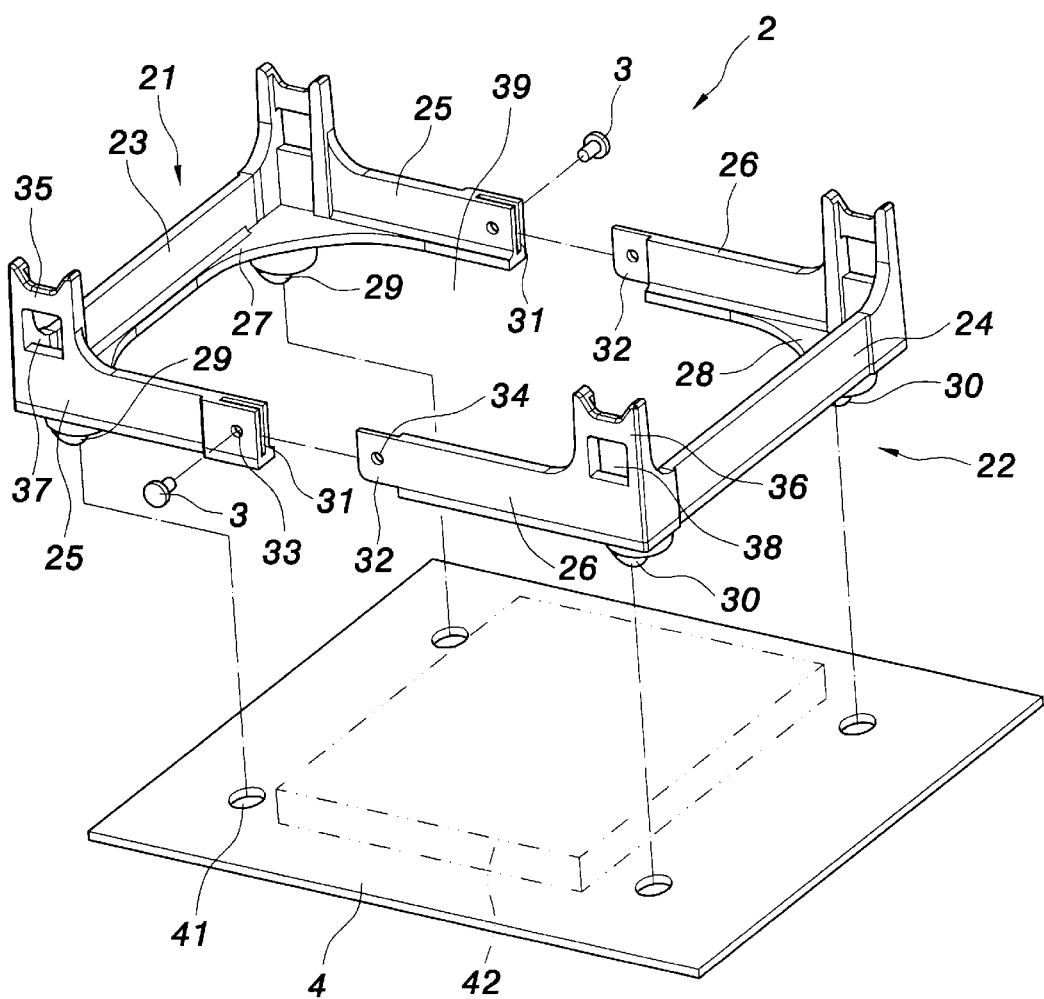
FIG. 3 is an exploded diagram of a fixing device mounting mechanism according to the present invention.
Figure 4:
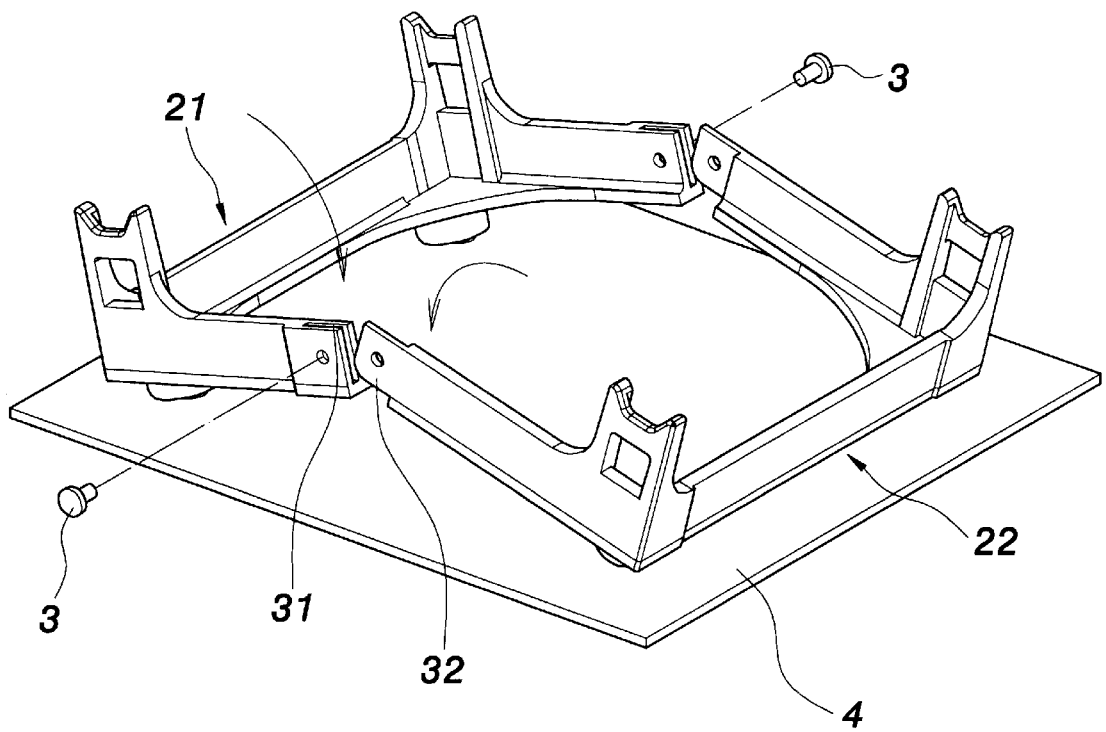
FIG. 4 is an intermediate state of the fixing device mounting mechanism according to the present invention.
Figure 5:
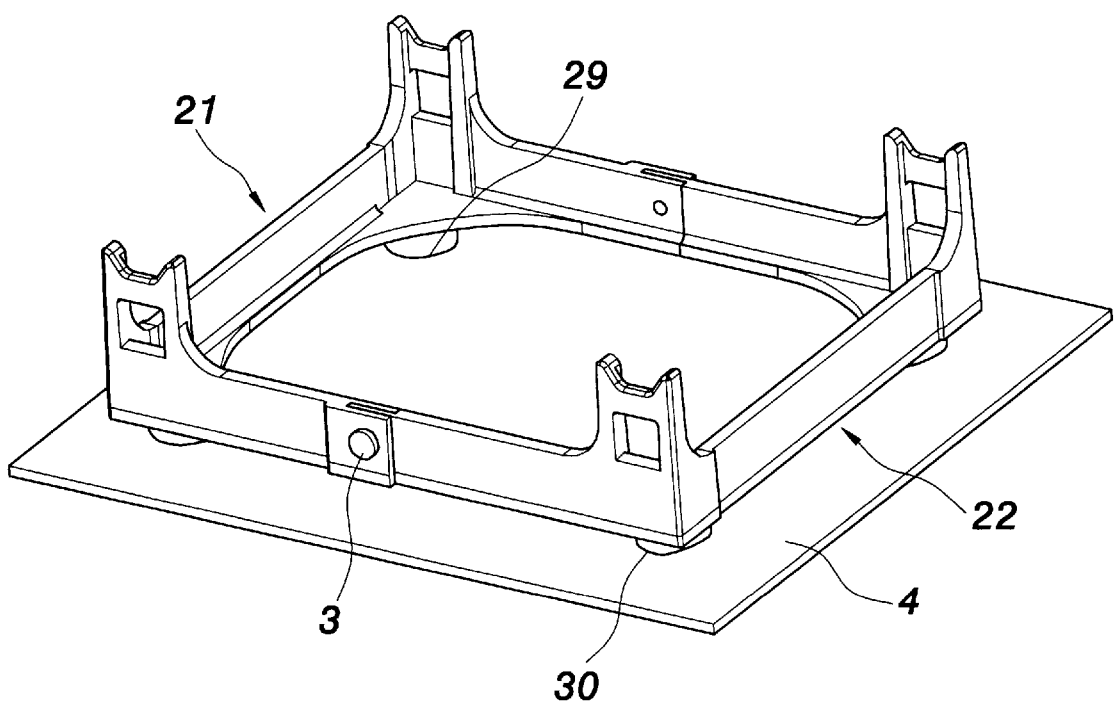
FIG. 5 is a perspective view of the fixing device mounting mechanism after mounting on a circuit board.
Figure 6:
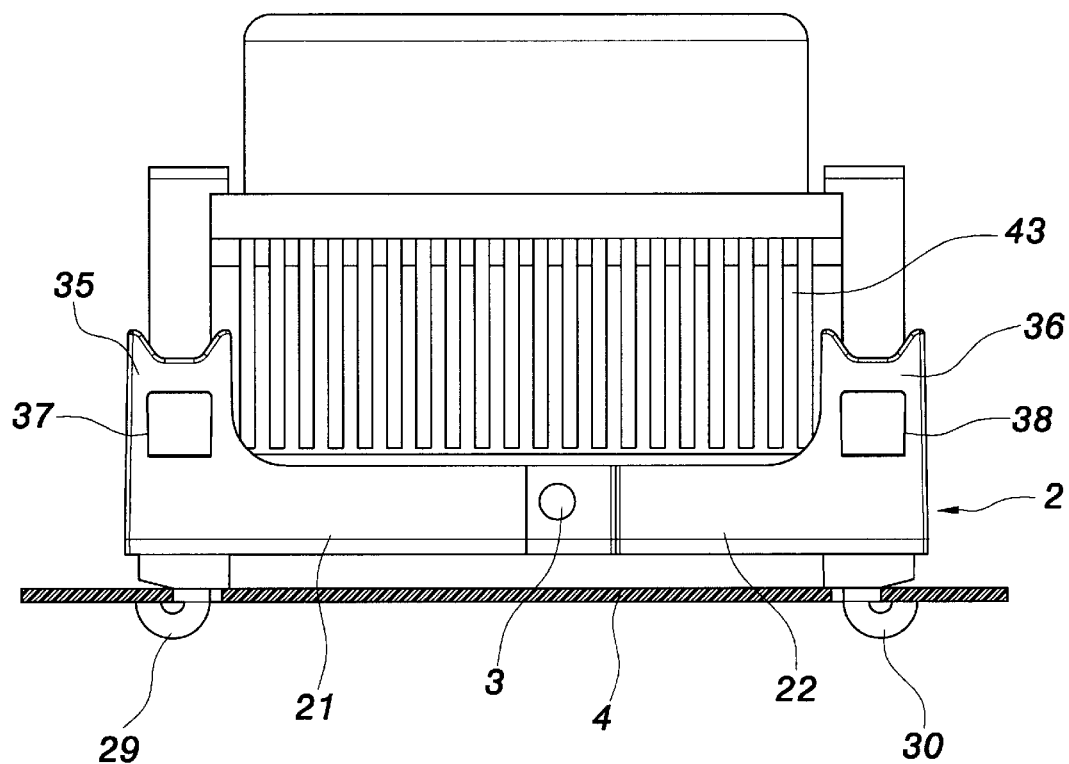
FIG. 6 is a cross sectional view of the fixing device.

Please refer to FIG. 3 to FIG. 6. FIG. 3 is an exploded diagram of a fixing device mounting mechanism according to the present invention. FIG. 4 is an intermediate state of the fixing device mounting mechanism according to the present invention. FIG. 5 is a perspective view of the fixing device mounting mechanism after mounting on a circuit board. FIG. 6 is a cross sectional view of the fixing device. This invention provides a base frame 2. The base frame is separated into two frame bodies: a left-side frame body 21 and a right-side frame body 22. Each of the two frame bodies has a U-shaped integral structure from a top view. The left-side frame body 21 has a long side 23, two opposite short sides 25 and an inner periphery 27 located at the intersections of the long side 23 and the two short sides 25. Likewise, the right-side frame body 22 has a long side 24, two opposite short sides 26 and an inner periphery 28 located at the intersections of the long side 24 and the two short sides 26. Buckling pieces 29 and buckling pieces 30 are integrally formed underneath the inner periphery 27 and inner periphery 28, respectively. The buckling pieces 29 and buckling pieces 30 insert into associated positioning holes 41 on a circuit board 4. The left-side frame body 21 and the right-side frame body 22 define an opening 39 for accommodating a CPU 42.

As shown in FIG. 3, a slot 31 is provided on a distal portion of each of the short sides 25 of the left-side frame body 21. A through hole 33 penetrating the slot 31 is formed on the distal portion. An extending wedge member 32 that can be fittingly inserted into the slot 31 is provided on each of the distal portions of the short sides 26 of the right-side frame body 22. A mid-passing hole 34 is located on the extending wedge member 32 corresponding to the through hole 33. When the extending wedge member 32 is inserted into the slot 31, the through hole 33 and the mid-passing hole 34 constitute a tunnel that allows a mounting piece 3 to pass. The mounting piece 3 is a bolt. Further, vertical plates 35 with through holes 37 are provided at corners of the base frame 2.

Referring to FIG. 4 with respect to FIG. 3, when installing the base frame 2, the buckling pieces 29 and buckling pieces 30 are slightly inserted into the associated positioning holes 41 on the circuit board 4. At this phase, as the folded structure shown in FIG. 4, the extending wedge member 32 of the right-side frame body 22 slightly engages with the slot 31 of the left-side frame body 21. As mentioned, a CPU 42 is mounted in an opening 39 defined by the left-side frame body 21 and the right-side frame body 22 and a heat sink 43 is installed on the inner periphery 27 and inner periphery 28 (as shown in FIG. 6). The heat sink 43 has a lower surface in contact with the CPU 42 and is fixed by inserting wedge members (not shown) into the through holes 38 of the vertical plates 35.

In summary, this invention provides a combined base frame for supporting and fixing a CPU heat sink. The base frame has a left-side frame body 21 and a right-side frame body 22. The buckling pieces 29 and 30 are integrally formed under the base frame 2. The base frame 2 can be efficiently mounted on the circuit board 4 by the engagement between the left-side frame body 21 and a right-side frame body 22 (FIG. 4 to FIG. 5). When an operator needs to install a CPU onto the circuit board 4, the base frame 2 can be disassembled in a short time.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A fixing device for a heat sink, comprising:

a left-side frame body with a U-shaped structure from a top view, wherein said left-side frame body has a first long side, two first short sides, and first inner peripheries located at the intersections of said first long side and two first short sides, and wherein a first buckling piece is integrally formed under each of the first inner peripheries, and a slot is installed on a distal portion of each of said first short sides with a through hole thereon;

a right-side frame body with a U-shaped structure from a top view, wherein said right-side frame body has a second long side, two second short sides, and second inner peripheries located at the intersections of said second long side and two second short sides, and wherein a second buckling piece is integrally formed under each of the second inner peripheries, and an extending wedge member is installed on a distal portion of each of said second short sides with a mid-passing hole formed thereon; and a pair of mounting pieces, wherein each of said mounting pieces passes through said through hole and said mid-passing hole to fix said extending wedge member that inserts into said slot, and wherein said left-side frame body and said right-side frame body define an opening for accommodating a CPU and a heat sink is installed on said first and second inner peripheries for contacting the CPU.

2. The fixing device of claim 1 wherein vertical plates are further provided at intersections of said first long side and two first short sides of said left-side frame body and intersections of said second long side and two second short sides of said right-side frame body.

3. The fixing device of claim 1 wherein said mounting piece is a bolt.

* * * * *